United States Patent [19]

VonArx et al.

[11] Patent Number: 5,003,430
[45] Date of Patent: Mar. 26, 1991

[54] CONTROLLER WITH SNAP-ON RELAY MODULE

[75] Inventors: Ted VonArx, Lacrescent, Minn.; Gerald J. Klaves, Kenosha, Wis.

[73] Assignee: Watlow/Winona, Inc., Winona, Minn.

[21] Appl. No.: 245,143

[22] Filed: Sep. 16, 1988

[51] Int. Cl.⁵ .............................................. H05K 7/02
[52] U.S. Cl. .................................. 361/395; 336/107; 361/413; 439/76; 439/928
[58] Field of Search ............... 200/307; 336/105, 107; 335/202; 337/373; 439/65, 76, 928, 79; 361/331, 380, 393, 394, 395, 396, 400, 413; 338/162, 163

[56] References Cited

U.S. PATENT DOCUMENTS

| | | | |
|---|---|---|---|
| 4,281,359 | 7/1981 | Bayer | 361/393 |
| 4,322,120 | 3/1982 | Rilling | 439/928 |
| 4,401,351 | 8/1983 | Record | 439/928 |
| 4,713,498 | 12/1987 | Ludwig | 200/307 |
| 4,790,762 | 12/1988 | Harms | 439/65 |

Primary Examiner—Gerald P. Tolin
Attorney, Agent, or Firm—Hugh D. Jaeger

[57] ABSTRACT

Electronic temperature controller including a snap-on relay module which snaps into the electronic temperature controller. Any compatible relay module with any different numbers of poles can be accepted by manually disengaging a relay module from clips on the electronic temperature controller. Ball-stud assemblies on the relay module frictionally engage into a plurality of receptacles in the electronic temperature controller. A geometrical configuration provides for knob to potentiometer orientation and alignment including radial and axial stress relief for the potentiometer.

5 Claims, 13 Drawing Sheets

CONTROLLER WITH SNAP-ON RELAY MODULE

CROSS REFERENCES TO CO-PENDING APPLICATIONS

Design patent application Ser. No. 07/190,524, filed May 5, 1988, entitled "Relay Control" assigned to the same company as this patent application.

BACKGROUND OF THE INVENTION

1. Field of the Invention

The present invention relates to a temperature control device, and more particularly, pertains to an electronic temperature controller with a uniquely aligned control knob which also includes a detachable control relay module.

2. Description of the Prior Art

Prior art electronic controller designs have utilized methods which have rigidly mounted the control circuits, either enclosed or open-board, onto the mercury displacement relay (MDR) coils, coil brackets or the contact assemblies. These prior art methods have used screw fasteners in a multipoint arrangement to maintain mounting security. In general, the mounting geometries of these prior art designs have required that a multiple number of the same type of control circuits be packaged to permanently engage with the various coil forms and/or contact configurations in the MDR structure. Electrical connections between the prior art temperature controls and the relay coils have been by common wiring techniques. The prior art structures have often utilized some form of mounting screws for this purpose. Prior art time delay function modules utilized discrete wires routed between the control and the coil connections. These hard wire techniques did not provide for interchangability nor for easy replacement or servicing.

Methods commonly employed for mounting a control knob onto a potentiometer shaft generally utilized some form of a metal insert and/or a set screw. Prior art calibration orientation utilized a flattened shaft and flat mating surface in the control knob assembly.

The present invention overcomes the disadvantages of the prior art by providing a mechanical package which mounts an industrial control electronic system onto an MDR coil assembly.

SUMMARY OF THE INVENTION

The general purpose of the present invention is to provide a temperature relay controller electronics package which engages to mercury displacement relay coil assemblies. The temperature controller includes two major components which frictionally engage and snap together to cooperate in conjunction with each other to control external temperature maintaining device by interfacing of two major components which consist of an electronic temperature controller and a mercury displacement relay coil assembly. A plurality of plastic spring tabs on the electronic temperature controller engage members of the mercury displacement relay coil (MDR) assembly to provide mechanical engagement of the two major components. Ball-stud electrical contactor assemblies extend from the MDR coil assembly to further engage a plurality of spring clips interior to the electronic temperature controller to provide additional mechanical securement of the component members and also to provide electromechanical connection between the relay coil and electronic controller. A further unique arrangement of a configured collar and an insert provides for alignment of a temperature control knob through a front cover to a potentiometer on an internal electronic circuit board. Radial and axial stress relief are provided for the potentiometer by the configured collar and the insert in conjunction with a pin on the temperature control knob which rides in a terminated circular groove in a front housing member.

According to one embodiment of the present invention, there is provided an electronic temperature controller which secures physically and electrically to a coil assembly by spring clip members extending from the electronic temperature controller to electromechanically engage ball-stud assemblies extending from a relay coil assembly. In a complementary fashion, the ball-stud assemblies extend from the coil assembly to engage the spring clip members in the electronic temperature controller to complete electromechanical engagement and to accomplish electrical connection between the electronic temperature controller and the MDR coil assembly.

Another embodiment of the present invention illustrates a potentiometer connected to a control knob by an intermediate collar and an insert placed concentrically through a hole in the face of the electronic control front panel.

Significant aspects and features of the present invention include a clipping arrangement, illustrated in detail in various views of the figures, which provides a method of mounting a control housed in the mechanical package expeditiously. The radial geometry of the spring clips allows relative ease in installation or removal. Flexibility in design provides a package which fits a plurality of coil assemblies.

Another significant aspect and feature of the present invention is the novel method of electrical contact between the coil assembly and the electronic controller. The primary features are the ball-stud assemblies and the spring clip members mounted on the electronic control board. Also, the aligning action of the back cover openings are a necessary part in the operation of this feature.

Having described several embodiments of the present invention, it is the principal object hereof to provide an electronic controller with a snap-on relay coil.

One object of the present invention is an electronic temperature controller which electromechanically secures and electrically connects to a relay coil assembly in a snapping frictional engagement.

Another object of the present invention is the method of electrical and mechanical engagement between a relay coil assembly and an electronic temperature control.

Still another object of the present invention is an electronic temperature controller which can be used with different coil assemblies having different numbers of poles, such as one, two or three.

A further object of the present invention is a control knob which can be easily and accurately assembled to the electronic control device.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
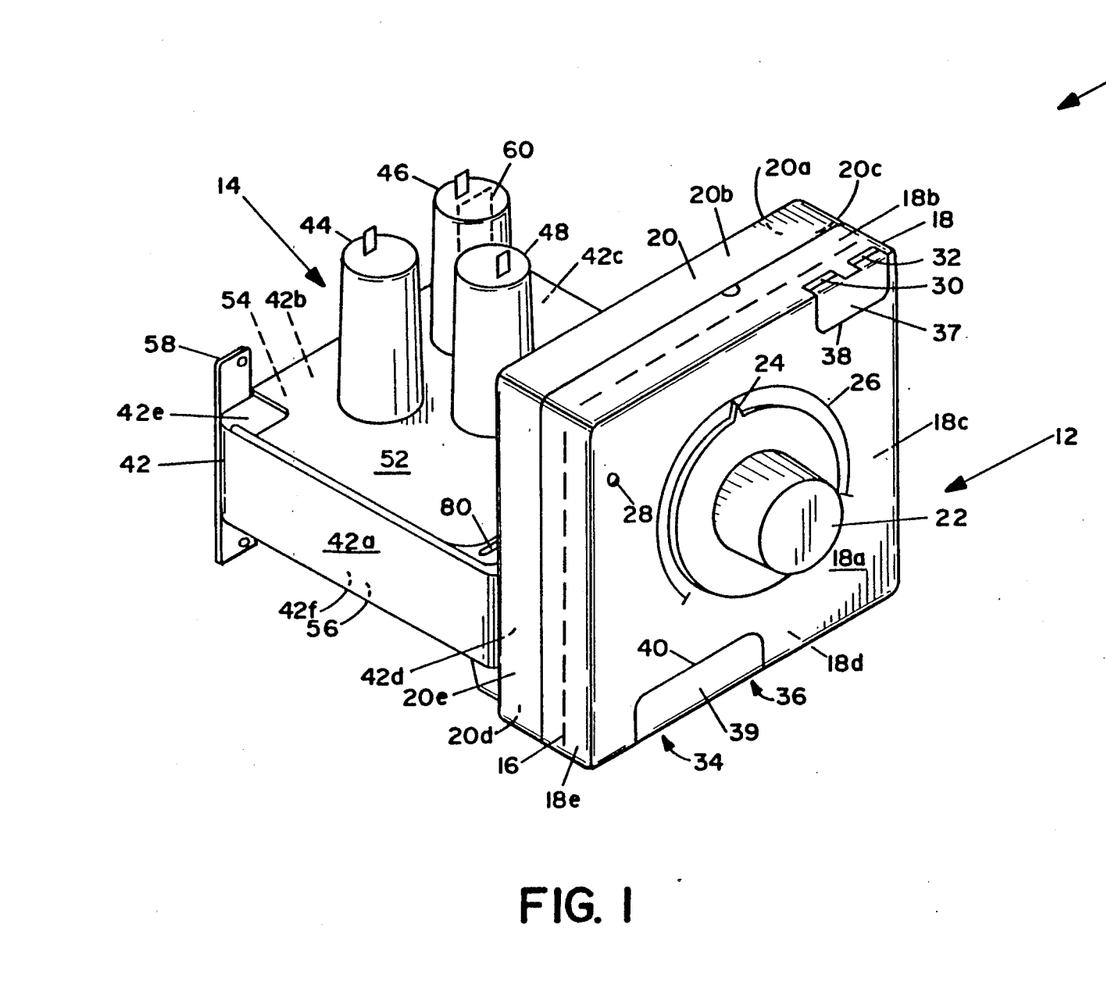
FIG. 1 illustrates a perspective view of an electronic controller and an MDR relay coil assembly.

FIG. 1 illustrates a perspective view of an electronic temperature controller with a snap-on relay coil assembly 10 including an electronic temperature controller 12 and a snap-on mercury displacement relay (MDR) coil assembly 14. Components of the electronic temperature controller 12, illustrated in FIG. 1, include an electronic circuit board 16 enclosed in a front cover 18 with a front side 18a, sides 18b–18e, and a back cover 20 including a back side 20a also with sides 20b–20e. A temperature setting control knob 22 with a pointer 24 extends from the front cover 18. A temperature scale 26, which is used to set a desired temperature, is concentric about the temperature setting control knob 22. An LED 28 on the front side 18a illuminates when the MDR's coils are energized. Thermocouple inputs 30 and 32 position along the edge of the side 18b for accommodation of thermocouple input wires. Power line inputs 34 and 36 position along the side 18d for accommodation of a power line. Covers 37 and 39 snap into recesses 38 and 40 in the cover front surface 18a to cover the electrical contacts lying behind the thermocouple inputs 30 and 32 and the power line inputs 34 and 36.

Figure 7:
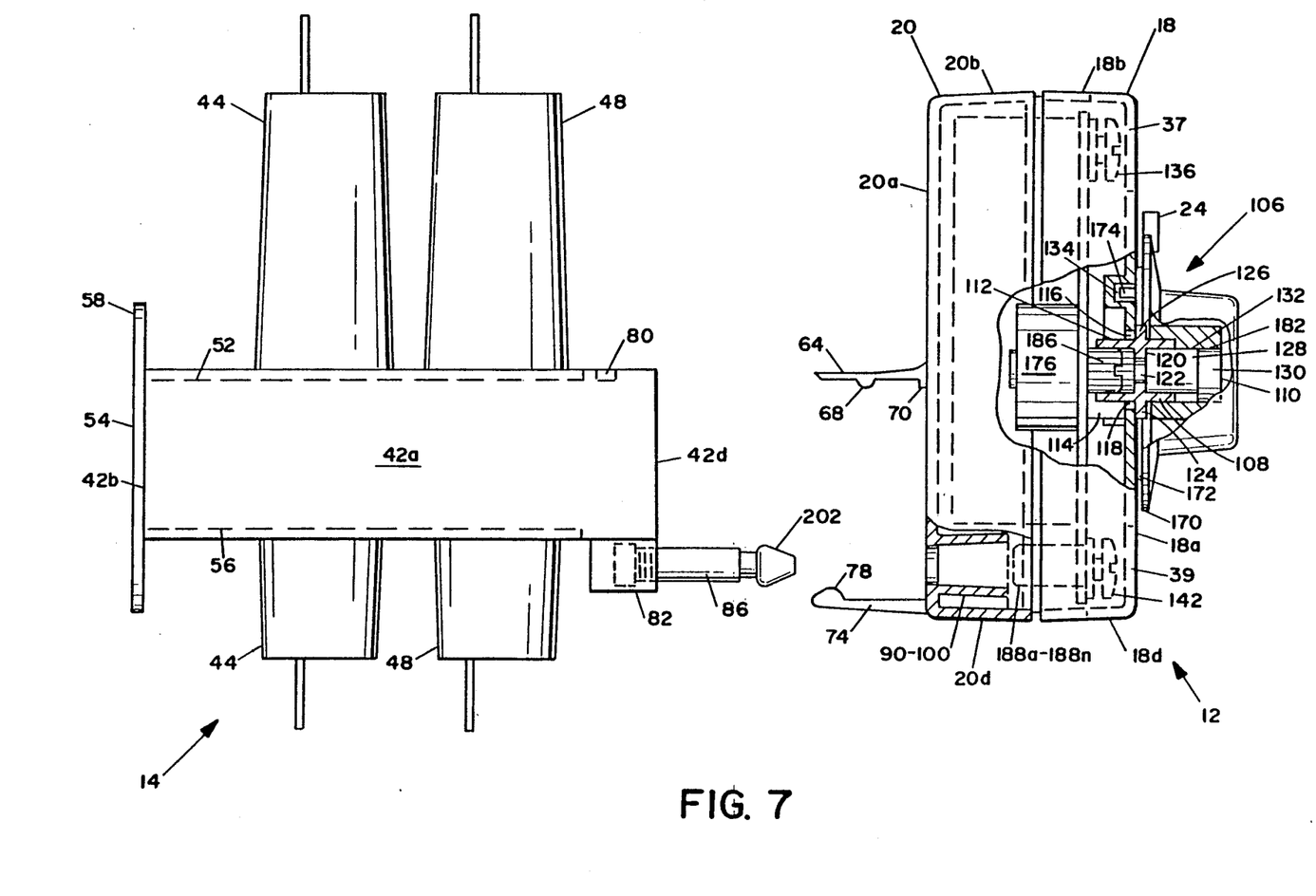
FIG. 7 illustrates a side view in partial cross section of the electronic temperature controller prior to engagement with the MDR coil assembly.

FIG. 1, which also illustrates components of the snap-on MDR coil assembly 14, include a plastic box like housing member 42 including plastic sides 42a–42d, a plastic top surface 42e and a plastic bottom surface 42f. A U-shaped bracket 50 includes a metal upper planar surface 52 which fits over a top plastic surface 42e, a metal rear planar surface 54 which fits over side 42b and a lower planar surface 56 which fits over the bottom surface 42f. A plurality of MDR coil poles, each with upper and lower connector terminals and including MDR coil terminals 44, 46, and 48 mount on the metal upper planar surface 52 and extend through the metal lower planar surface 56, as illustrated in FIG. 7. Mounting tabs 58 and 60, part of the U-shaped bracket 50, extend vertically along the metal rear planar surface 54 to accept mounting of the controller/relay 10 to an external mounting panel.

Figure 2:
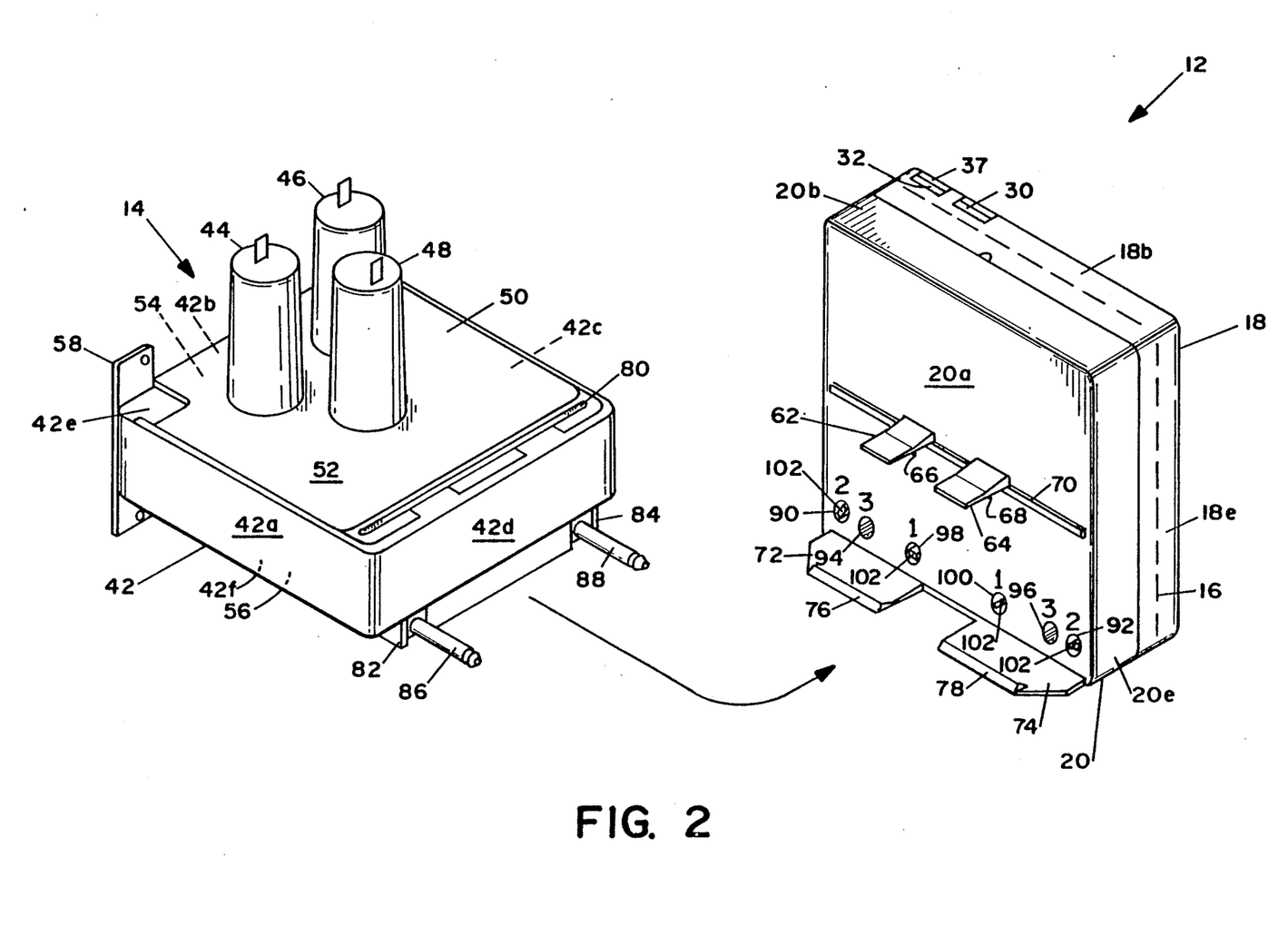
FIG. 2 illustrates a perspective view of the snap-on MDR coil assembly prior to engaging with the electronic temperature controller.

FIG. 2 illustrates a perspective view of the snap-on MDR coil assembly 14 disengaged from the electronic temperature controller 12. Illustrated in particular are the electromechanical structural members which provide for physical and electrical snapping frictional engagement of the snap-on MDR coil assembly 14 with electronic temperature controller 12. All numerals correspond to those elements previously described. Flexible tapered spring mounting tabs 62 and 64 extend horizontally and outwardly from the midportion of the back side 20a. Each of the flexible tapered spring mounting tabs 62 and 64 include beveled tabs 66 and 68 extending along the midportion of the underside of the mounting tabs 62 and 64 parallel to the plane of the back side 20a. A support member 70 extends outwardly from the back side 20a, and intersects part of an inboard portion of mounting tabs 62 and 64. Lower tapered spring mounting tabs 72 and 74 extend horizontally and outwardly from the lower portion of the back side 20a. The lower tapered spring mounting tabs 72 and 74 include beveled tabs 76 and 78 extending along the upper outer edge of lower tapered spring mounting tabs 72 and 74 parallel to the plane of the back side 20a. The tapered spring mounting tabs 62 and 64 and lower tapered spring mounting tabs 72 and 74 of the electronic temperature controller 12 electromechanically engage members of the snap-on MDR coil assembly 14 as later described in detail.

A groove 80 in the top surface 42e aligns parallel to the side surface 42d of the box like housing member 42 for accommodation of the tapered spring mounting tabs 62 and 64 of the electronic temperature controller 12. A plurality of plastic mounting blocks including mounting blocks 82 and 84 position on the underside of bottom surface 42f. Ball-stud assemblies 86 and 88 secure into the plastic mounting blocks 82 and 84 as later described in detail and extend perpendicularly from the mounting blocks 82 and 84 as illustrated. The back, inboard side of the plurality of mounting blocks 82 and 84 are ultimately engaged by the beveled tabs 76 and 78 of the lower tapered spring mounting tabs 72 and 74 as later described in detail. Frictional mechanical engagement of the electronic temperature controller 12 and the snap-on MDR coil assembly 14 is accomplished by engagement of the respective elements as later described.

Additional mechanical and electrical support is accomplished by engagement of ball-stud assemblies 86 and 88 of the snap-on MDR coil assembly 14 with electrical connectors or clips in the back side 20a of the electronic temperature controller 12. A plurality of receptor holes includes hole pairs 90–92, 94–96, and 98–100 in the back side 20a of the electronic temperature controller 12, one pair at least which physically and electrically accepts the ball-stud assemblies 86 and 88. Snap-on MDR coil assemblies such as assembly 14 can utilize different numbers of coil poles and different physical dimensions and spacings. The spacing of the ball-stud assemblies 86 and 88 can be varied to fit in any of the required hole pairs 90–92, 94–96 or 98–100. In this figure, ball-stud assemblies 86 and 88 engage metal spring clips behind the hole pair 94–96 to electrically and mechanically connect the coils of the MDR coil terminals 44, 46 and 48 to the electronic circuit board 16. Hole pairs 90–92 and 98–100 can be plugged with removable plastic dummy plug 102 to prevent misalignment of the snap-on MDR coil assembly 14 with the internal components of the electronic temperature controller 12.

Figure 3:
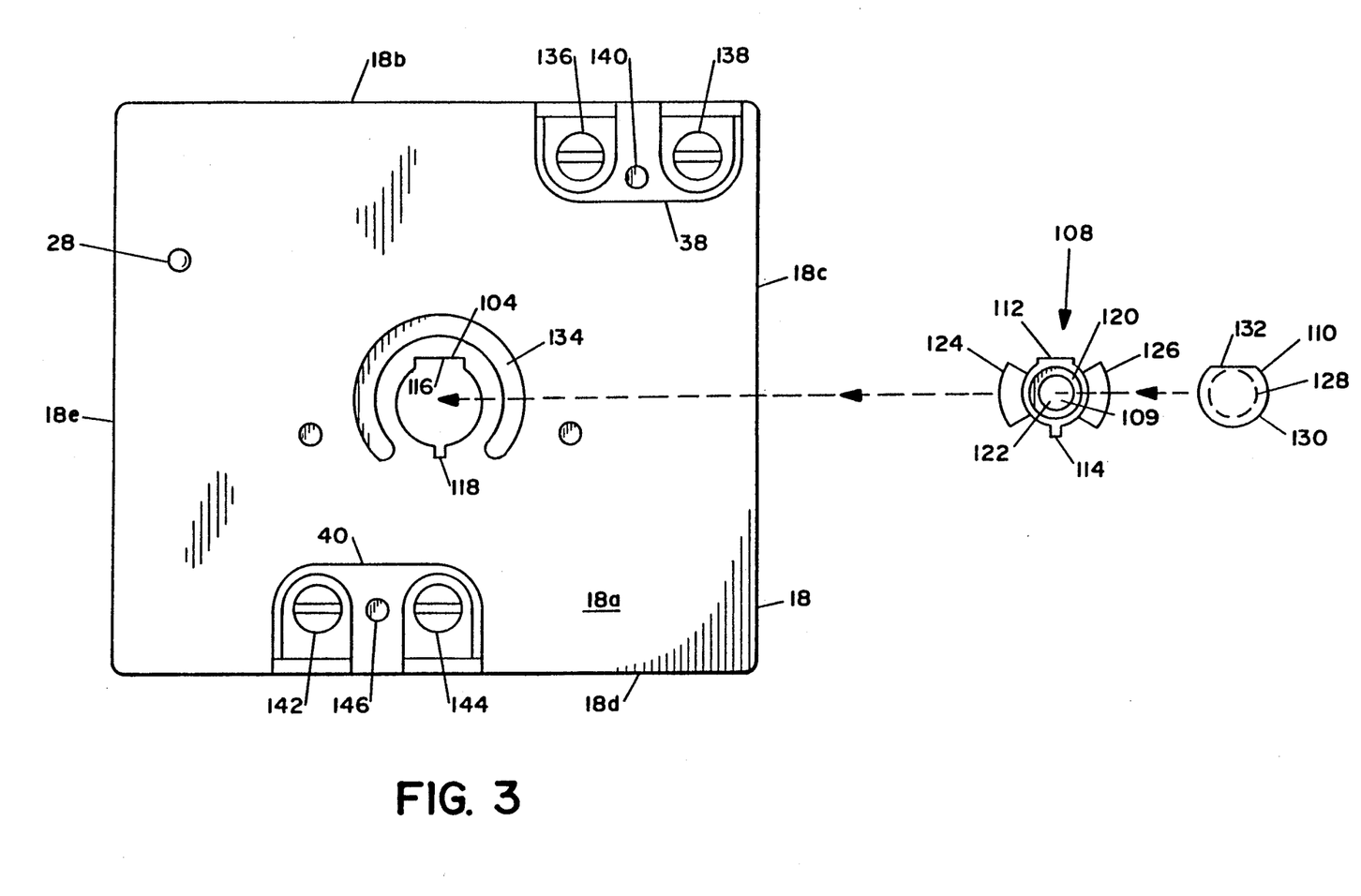
FIG. 3 illustrates a front view of the separated components of the front cover of the electronic controller.

FIG. 3 illustrates a front view of the separate components of the front cover 18 of the electronic temperature controller 12 with the temperature setting control knob 22 and covers 37 and 39 removed. All numerals correspond to those elements previously described. A geometrically configured front cover hole 104 locates centrally on the front side 18a to accommodate components of the potentiometer control assembly 106, also illustrated in FIG. 6, including a configured collar 108 and an insert 110. The configured collar 108 includes a cylindrical void 109, a flat top member 111, a tab 114 on the lower side, both of which align through corresponding flat member 116, and a tab slot 118 in the front cover hole 104. The configured collar 108 also includes an internal stop ring 120 and a passage hole 122 through the middle of the internal stop ring 120. Stop dogs or ears 124 and 126 position perpendicularly to the collar axis and allow one end of the configured collar 108 to fit partially through the front cover hole 104. The main shaft 128 of the insert 110 aligns in the interior cylindrical void 109 of the configured collar 108 and includes a larger radius shaft 130 and a flat member 132 across the top of the larger radius shaft. A recessed arcular groove 134 aligns concentric to the front cover hole 104. Thermocouple wire connector screws 136 and 138 and a receptor hole 140 reside in the cover recess 38. Line wire connector screws 142 and 144 and a receptor hole 146 reside in the cover recess 40. Receptor holes 140 and 146 frictionally engage pins 148 and 150 on the backside of covers 37 and 39.

Figure 4:
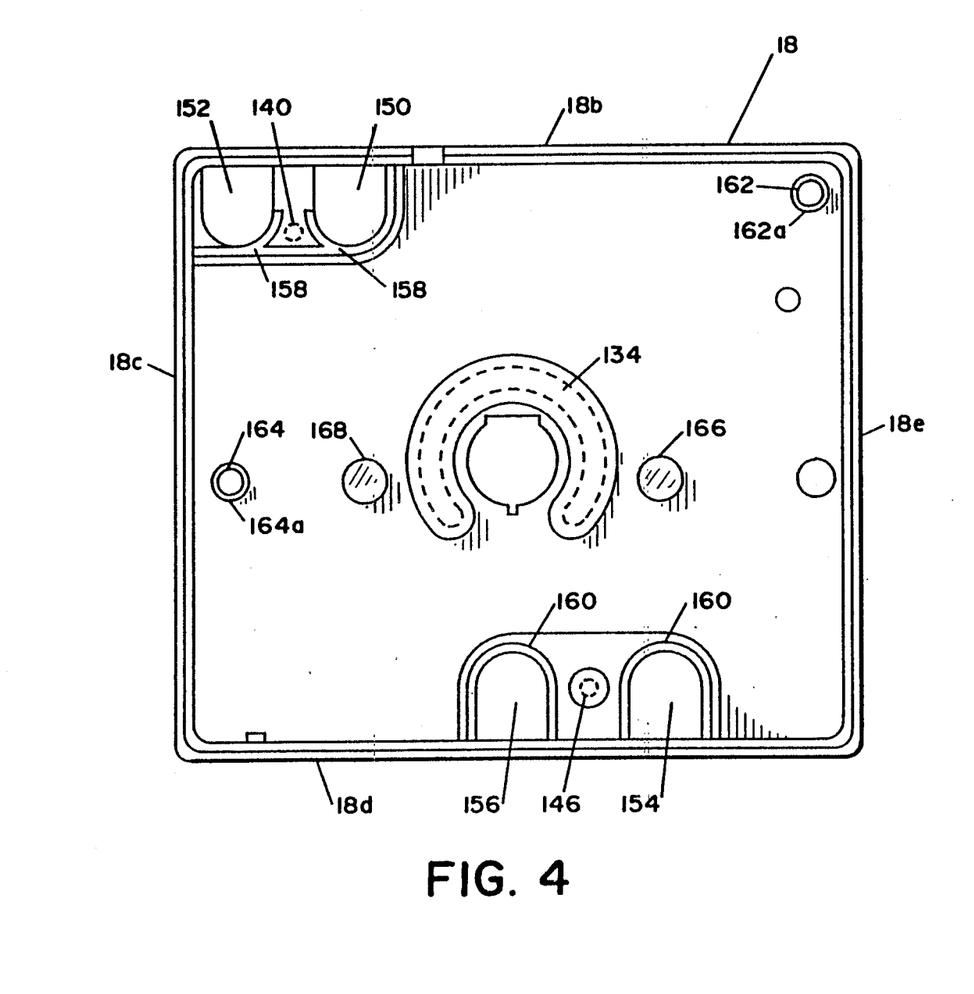
FIG. 4 illustrates a rear view of the front cover.

FIG. 4 illustrates a rear view of the front cover 18 where all numerals correspond to those elements previously described. Shown in particular are the cavities 150, 152, 154 and 156, and their associated side wall partitions 158 and 160 for accommodation of thermocouple wire connector screws 136 and 138 and 142 and 144, respectively. Circuit board alignment pins 162 and 164 extend perpendicular from the rear side of the front cover 18 and include circuit board support shoulders 162a and 164a. Circuit board support pins 166 and 168 are located adjacent to the arcular groove member 134, and extend to about the same height as the circuit board support shoulders 162a and 164a. Sidewall partitions 158 and 160 also extend about a similar distance to support the edges of the circuit board.

Figure 5:
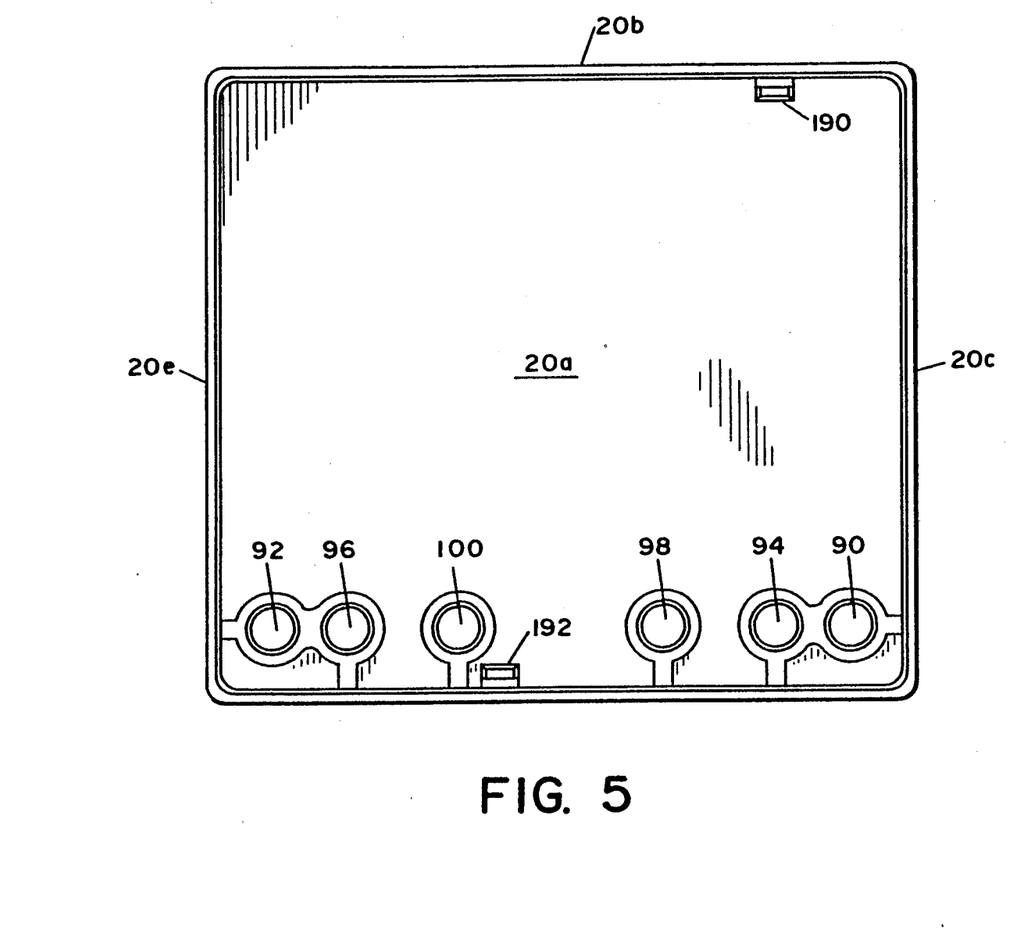
FIG. 5 illustrates a view of the interior of the back cover.
Figure 8:
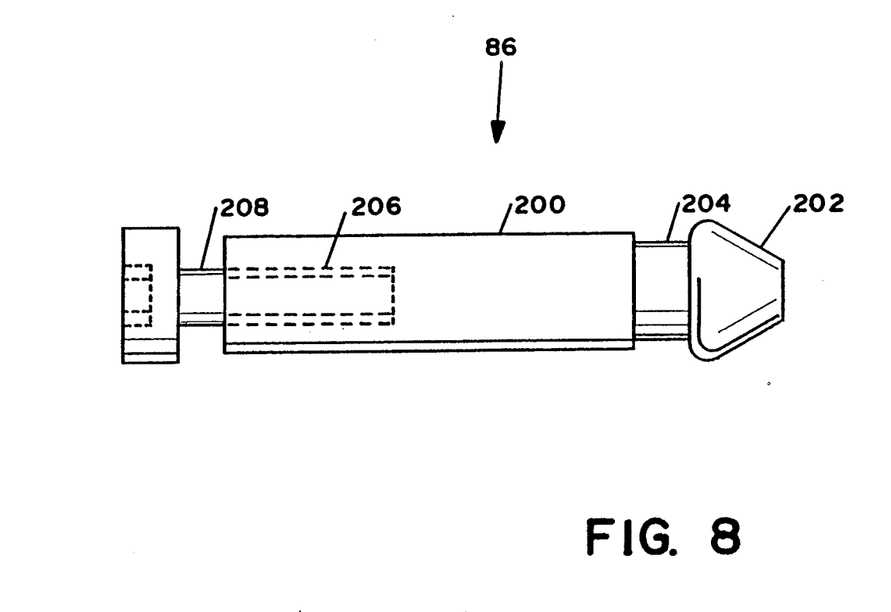
FIG. 8 illustrates a side view of the ball-stud and spring clip.

FIG. 5 illustrates a view of the interior of the back cover 20 and illustrates the hole pairs 90–92, 94–96 and 98–100 which are tapered and have a decreasing radius of cylindrical taper toward the exterior of the back cover 20. All other numerals correspond to those elements previously described. The cylindrical taper allows for play in the ball-stud assemblies 86 and 88 during engagement and disengagement of the ball-stud assemblies with and from the spring clips 188a–188n, as illustrated in FIGS. 6, 7 and 8.

Figure 6:
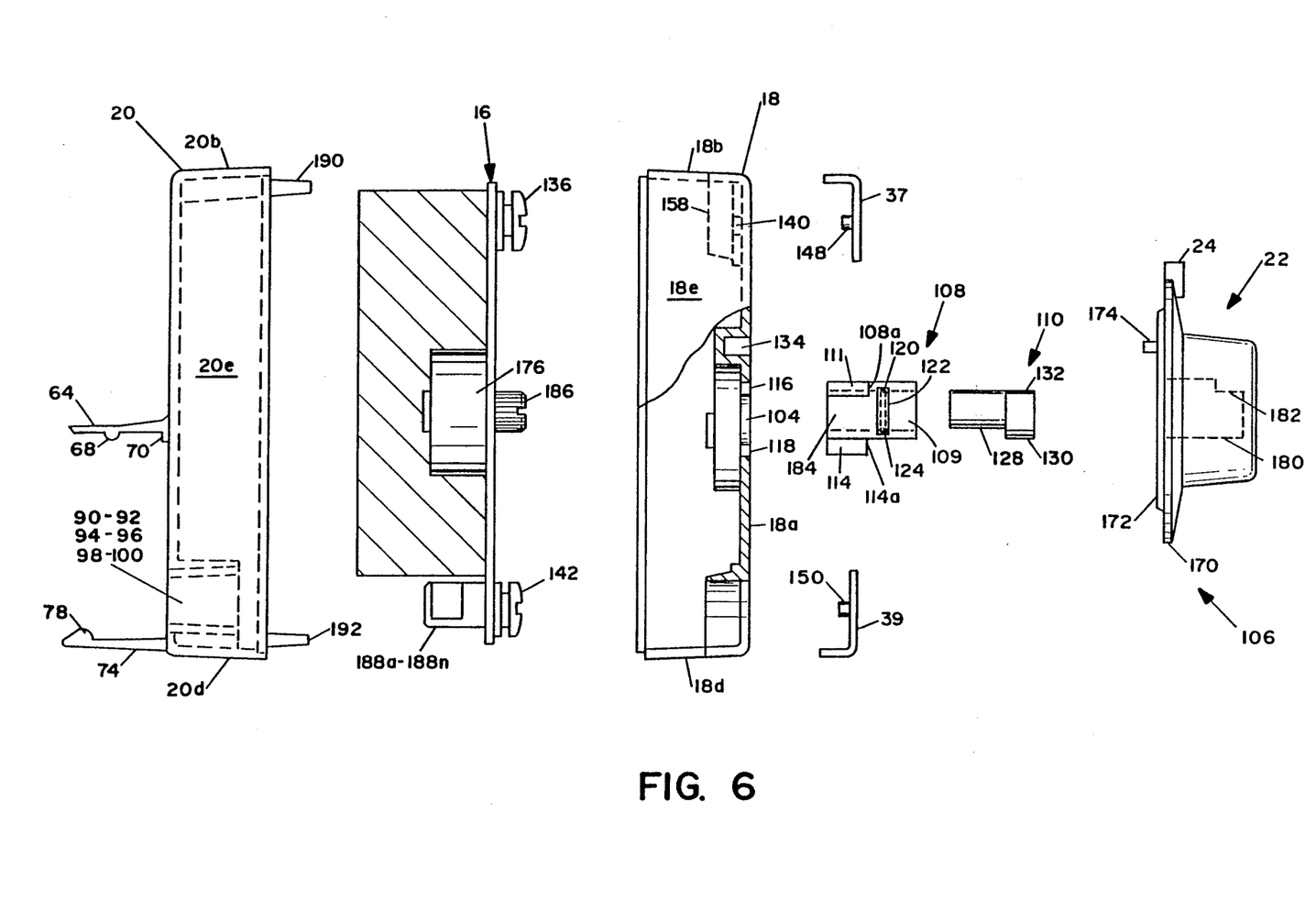
FIG. 6 illustrates an exploded view in partial cross section of the individual components of the electronic temperature controller.

FIG. 6 illustrates an exploded side view in partial cross section of the individual components of the electronic temperature controller 12 where all numerals correspond to those elements previously described. The potentiometer control assembly 106 includes the temperature setting control knob 22, the insert 110, and the configured collar 108 which, in conjunction with the arcular groove 134, controls rotational movement and movement along the axis of the potentiometer control assembly 106.

The temperature control knob 22 includes a pointer 24 on the circumference of the knob skirt 170. A spacing ring 172 supports a pin 174 which engages the arcular groove 134 to limit knob movement and movement of a potentiometer 176 mounted on the electronic circuit board 16. A hole central to the temperature setting control knob 22, conforms to the shape of the combined insert 110 and configured collar 108, and includes a cylindrical hole 180 and a flat portion 182. The insert 110 engages the cylindrical hole 180 in the temperature setting control knob 22 with the flat member 132 of the insert 110 aligned with the flat portion 182. Main shaft 128 of the insert 110 engages the cylindrical void 109 and bottoms out against the internal stop ring 120. The configured collar 108 partially engages the front cover hole 104 to the point where the stop dogs 124 and 126 engage front side 18a to limit travel along the axis of the potentiometer control assembly 106 toward the potentiometer 176. A fluted cylindrical interior 184 engages the fluted cylindrical shaft 186 of the potentiometer. Pin 174 on temperature setting control knob 22 loosely engages the arcular groove 134. It is noted that the arc described by the arcular groove is less than that described by the arcular movement of the potentiometer 176. Total engagement of the potentiometer control assembly 106 with the potentiometer 176 is illustrated in FIG. 7.

Figure 13:
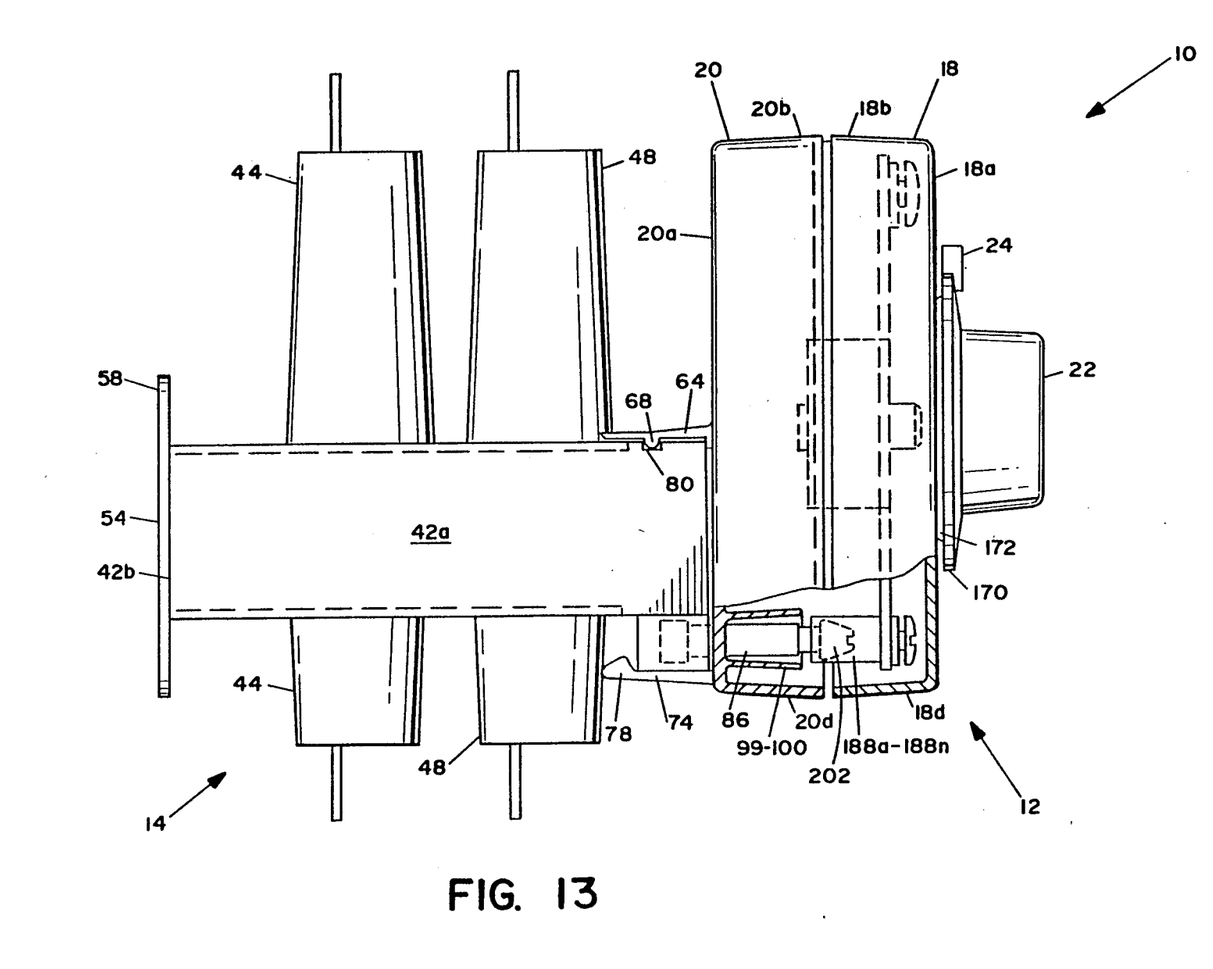
FIG. 13 illustrates a side view in partial cross section of the MDR coil assembly engaging the electronic temperature controller.

A plurality of metal spring clips 188a–188n mount on the electronic circuit board 16, and align with the plurality of hole pairs 90–92, 94–96 and 98–100 and are further illustrated in FIGS. 7 and 13. Alignment pins 190 and 192 extend from the interior of the back cover 20 and engage the interior of the front cover 18.

FIG. 7 illustrates a side view in partial cross section of the electronic temperature controller 12 positioned for engagement with the snap-on MDR coil assembly 14. The electronic temperature controller 12 includes the potentiometer control assembly 106 engaging the fluted cylindrical shaft 186. The two covers 18 and 20 are joined at their mating seams by an ultrasonic (UT) welding process to form the housing for the electronic temperature controller 12. After the UT weld operation, the shaft of the potentiometer 176 is rotated completely counterclockwise and the configured collar 108 is fitted over the fluted cylindrical shaft 186. The assembly of the electronic temperature controller 12 is continued by positioning the insert 110 into the configured collar 108, rotating the resultant linking element of the potentiometer control assembly 106 including the fluted cylindrical shaft 186, insert 110 and the configured collar 108 in a clockwise direction, and fitting the temperature setting control knob 22 over the insert 110. Finally, terminal covers 37 and 39 and the snap-on MDR coil assembly 14 are properly positioned to complete the assembly of the control and relay package 10.

There is an important and intricate interplay in the geometries of the fluted cylindrical shaft 186, the insert 110, the configured collar 108 and temperature setting control knob 22 which provides the unique solution to a common design criterion. The configured collar 108 is designed to slide over the fluted cylindrical shaft 186. The configured collar 108 only goes through the front cover hole 104, shown in FIG. 3, in one specific orientation. A passage hole 122 in the configured collar 108 allows for any minute screwdriver adjustments of the fluted cylindrical shaft 186 position, which is initially set fully counterclockwise to facilitate the fit of the configured collar 108 over the fluted cylindrical shaft 186, and to overcome variances in mechanical position. The total depth that the configured collar 108 extends into the front cover 18 is controlled by the stop dogs 124 and 126 which are larger than the front cover hole 104. Once this depth has been reached, the configured collar 108 and insert 110 are again rotated fully counterclockwise and an external alignment fixture can be utilized to orient the flattened edge of the insert to a specific angle with respect to the dialscale. The insert 110 is glued to the configured collar 108 using a fast acting glue. The entire assembly is rotated sufficiently to allow the temperature setting control knob 22 to be installed. In practice, the temperature setting control knob 22 is glued to the insert 110. The pin 174 that extends from the temperature setting control knob 22 rides inside recessed arcular groove 134 which is specifically positioned in the front cover 18. The height of the temperature setting control knob 22 extends above the front side 18a and is controlled by the extended spacing ring 172 on the bottom of the temperature setting control knob 22.

The three distinct unique features this process of linking the fluted cylindrical shaft 186 to the user adjustable temperature setting control knob 22 are: (1) the ability to assemble to the device after the UT weld operation; (2) the manner that this structure achieves and maintains the necessary calibration alignment; and (3) the manner in which mechanical stops are utilized to provide radial and axial stress relief.

All of the parts are constructed of similar plastic materials, and adhere to one another during a UT weld operation. The ability to install the potentiometer control assembly 106 after the UT weld is a definite and distinct feature and advantage. This allows the dialscale to be printed on the front cover 18 after the weld operation, thereby maintaining a pleasing, smudge free appearance. The cost of all parts utilized in this linkage is therefore minimized.

The manner that this structure and the assembly process overcome the inherent mechanical variations to properly align the wiper of the potentiometer, the pointer of the knob, and the dialscale pointed on the front cover 18 is potentially its main advantage. The process described above alleviates mechanical tolerances in the structure and assembly of the potentiometer, which is the primary source of concern of the other assembly methods commonly in practice today. These mechanical variances include, but are not limited to, total mechanical rotation of the potentiometer 176, initial wiper position with respect to a fixed reference point, and the amount of wiper movement required to move from an end point to the start of the potentiometers linear resistance change region. This structure and process effectively and patentably overcomes these variations so that calibration of the control electronics can be achieved virtually independently of the final package as housed. The calibration need only maintain the same angular rotations from the actual end stop of the potentiometer wiper used. The final package is designed to establish correct gain and coarse offset characteristics as well as to be effective. Only a minor final offset adjustment is necessary to match an independent calibration of the control electronics to the calibration required in the final package. The cost savings inherent in this approach, along with the accuracy improvements and process control advantages apparent, justify these features to be significant and a state of the art advance.

Radial and axial stress relief are achieved by this structure in a number of ways. The total rotation of the temperature setting control knob 22 is limited by the pin 174 on the temperature setting control knob 22 riding inside the recessed arcular groove 134 in the front cover 18. This prevents radial stress from being transferred to the mechanical end stops of the potentiometer 176. Axial stress relief is achieved by the design of the configured collar 108 and the front cover hole 104. Stress relief in a direction toward the structure, again serving to prevent damage to the potentiometer 176, is maintained by the interference between the stop dogs 124 and 126 of the configured collar 108 and the front side 18a. Sufficient allowance has been provided in the structure to prevent the edge of the configured collar 108 closest to the edge of the electronic circuit board 16 from touching the surface of the electronic control board 16 even when force sufficient to bow the front cover 18 inwardly. The configured collar 108 is allowed to move freely along the axis of the fluted cylindrical shaft 186 within the limits defined by the extending ears. In this same structure, axial stress relief in the opposite direction, i.e., force away from the package, is achieved by the interference between the inner surface of the front cover 18 and the extension flat member 111 of the collar located in this area. Collectively and singularly, these elements achieve a manner of accurately positioning the dial pointer with every concern that the coupling mechanism remains intact without the use of any additional metal inserts, set screws, or other retaining hardware.

FIG. 8 illustrates a side view of the ball-stud assemblies 86 and 88 and spring clips 188a-188n where all numerals correspond to those elements previously described. Ball-stud assemblies 86 and 88 are similar in construction and ball-stud assembly 86 is illustrated for purposes of clarity and brevity. The ball-stud assembly 86 includes a one-piece cylindrical shaft 200 including on one end a tapered end 202, and a cylindrical shaft section 204 of less radius than the one-piece cylindrical shaft 200 therebetween. Threaded hole 206 in the end of the one-piece cylindrical shaft 200 accommodates an Allen head machine screw which bottoms out snugly against the bottom of the hole. Spring clips 188a-188n include a spring base 210, opposing arcuate spring arms 212 and 214 and circuit board mounting tabs 216 and 218.

Figure 9:
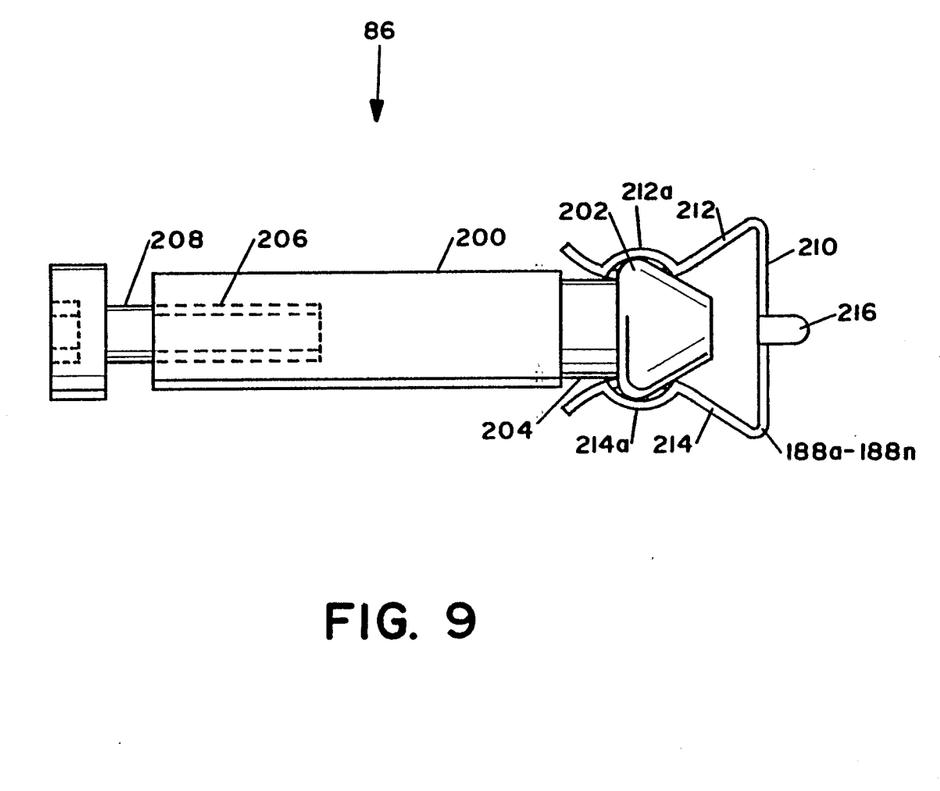
FIG. 9 illustrates a ball-stud engaging a spring clip.

FIG. 9 illustrates a ball-stud assembly 86 engaging spring clips 188a-188n. As the electronic temperature controller 12 and the snap-on MDR coil assembly 14 near the final mating stages, positive and secure electrical and mechanical contact between the two units is assured when the tapered end 202 of the ball-stud assembly 86 forces the arcuate spring arms 212 and 214 apart until the tapered end 202 seats between the curved portions 212a and 214a of the arcuate spring arms 212 and 214. Of course, at the same time, tapered plastic spring mounting tabs 62 and 64 engage groove 80 on the snap-on MDR coil assembly 14, and the lower tapered spring mounting tabs 74 and 72 engage mounting blocks 82 and 84, respectively, to physically and electrically connect and lock the snap-on MDR coil assembly 14 to the electronic temperature control 12 as illustrated in FIG. 13.

The tapered end of the ball-stud assemblies 86 and 88 eases initial insertion into the hole pairs 90 and 100, and gradually forces the ends of the spring clip to open as the electronic temperature controller 12 is pushed onto the snap-on MDR coil assembly 14. The hole pairs 90 and 100 force a "self-centering" alignment utilizing the spring clip connections as pivoting elements. Some mechanical foreplay is allowed in this alignment, the connections are not absolutely rigid, and the minimum diameter at the tapered end 202 of the ball-stud assembly is sufficiently less than the minimum opening of the fuse clip so that at a worst case tolerance provides for connection and operation. The screwdriver slot at the end of the ball-stud assembly is provided for user convenience when such are installed in the coil connections where a ball-stud assembly has not been previously utilized. The reliable electrical connection provided is enhanced by the wiping action of the tapered end 202 as it progresses into the arcuate spring clip edges. This is a patentable application for the common 0.250" diameter spring clip shown in FIG. 8, particularly because the mating part of the ball-stud enters the spring clip from a direction that is at right angles to the typical usage.

Figure 10:
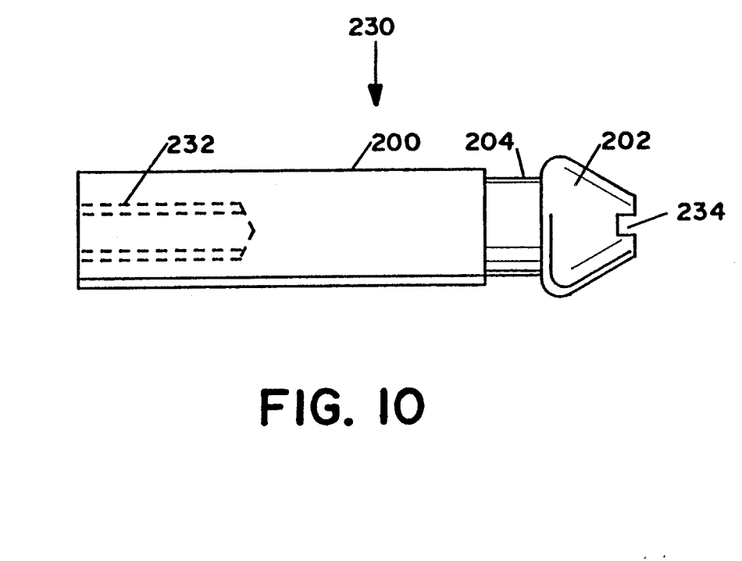
FIG. 10 illustrates a first alternative embodiment of a ball-stud.

FIG. 10 illustrates a first alternative embodiment of a ball-stud assembly 230 similar in shape to the ball-stud assembly 86 of FIG. 9 and including a threaded hole 232 for accommodation of various types of machine screw fasteners and a tightening slot 234 in the tapered end 202.

Figure 11:
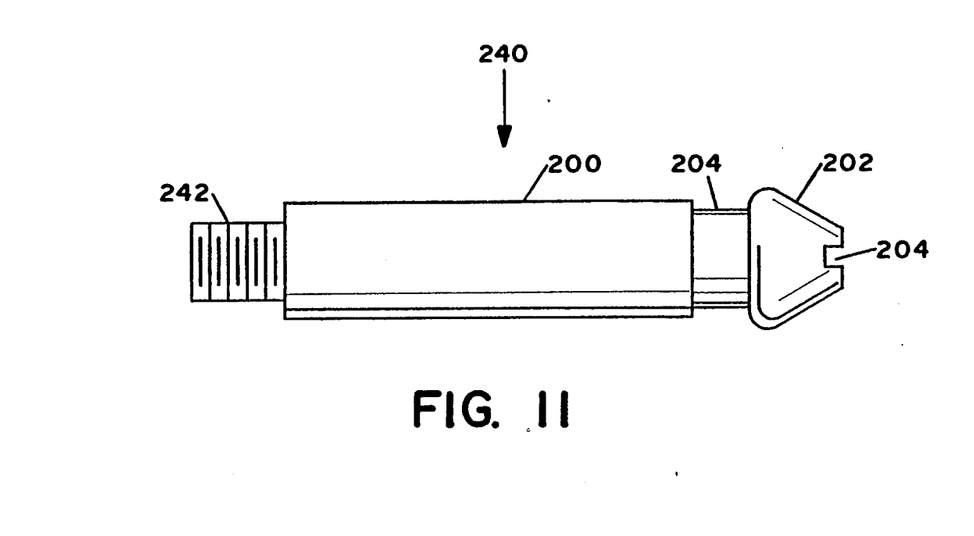
FIG. 11 illustrates a second alternative embodiment of a ball-stud.

FIG. 11 illustrates a second alternative embodiment of a ball-stud assembly 240 similar in shape to ball-stud assemblies 86 and 230, and including an integral threaded shaft 242 and a tightening slot 244 in the tapered end 202.

Figure 12:
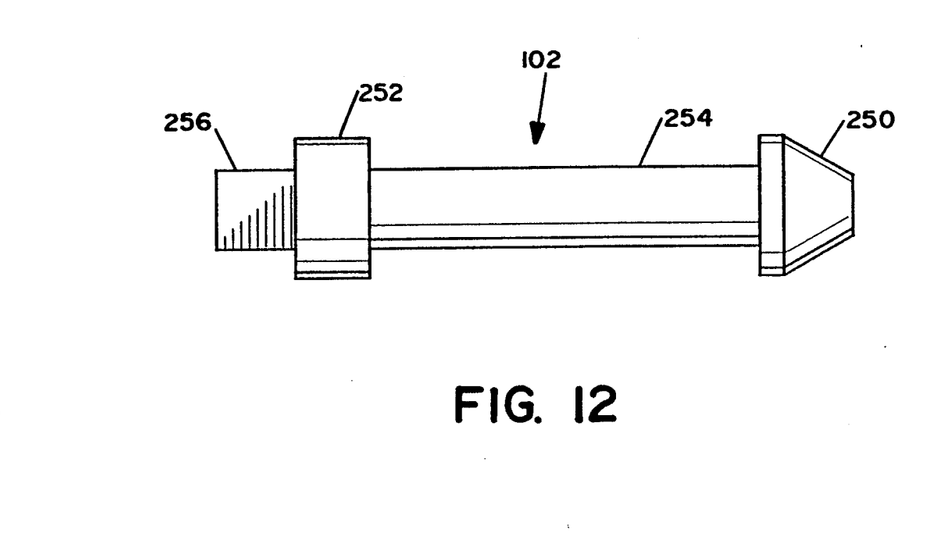
FIG. 12 illustrates a plastic dummy plug.

FIG. 12 illustrates a plastic dummy plug 102 utilized to fill the hole pairs 90-92, 94-96 and 98-100 in the back side 20a of the back cover 20. A tapered end 250 and a circular donut shaped member 252 oppose each other on opposite ends of a central cylindrical shaft 254. A rectangular shaped member 256 extends along the center line of the central shaft 254 from the donut shaped member 252. The rectangular shaped member 256 can be readily grasped by any hand tool for removal from a hole pair 90-100 and spring clips 188a-188n.

MODE OF OPERATION

FIG. 13 illustrates a side view in partial cross section of the snap-on MDR coil assembly 14 frictionally and electromechanically engaging the electronic temperature controller 12 to subsequently form the controller/relay package 10. The electronic temperature controller 12 is installed onto the snap-on MDR coil assembly 14 and the appropriate external thermocouple and line electrical connections are then made.

The first step in the mating process is to remove the two coil connection screws in mounting blocks 82 and 84 from a snap-on MDR coil assembly and then install the ball-stud assemblies 86 and 88 in their places. The electronic temperature controller 12 is centered on the snap-on MDR coil assembly 14, and then sufficient force is applied to "clip" the package onto the snap-on MDR coil assembly 14. Electrical connection between the control electronics and the MDR coil is through the ball-stud assemblies 86 and 88. The ball-stud assemblies 86 and 88 electromechanically engage with an appropriate number of spring clips 188a-188n as the beveled heads of these ball-stud assemblies insert into the spring clips 188a-188n, permanently mounted on the electronic circuit board 16. The plurality of opening pairs 90-100 exist in the back cover 20, and a plurality of spring clips are aligned with these openings, allowing this package to be used with any of the versions of the coil assemblies.

The necessary electrical line and thermocouple connections are then made by the user after the electronic temperature controller 12 has been properly mounted onto a snap-on MDR coil assembly 14. Switched high current connections are made at the MDR coil assembly contact terminals. Line power and sensory input connections are made at the electronic temperature controller 12 terminals after the covers 37 and 39 have been removed. These covers are then replaced after the connections are made.

Removal of the controller/relay 10 is achieved by removing the wires at the line and connector screws 142 and 144 and 136 and 138, and then pulling firmly on the top of the electronic temperature controller 12 with an up and down rocking motion with respect to the snap-on MDR coil assembly 14.

Various modifications can be made to the present invention without departing from the apparent scope hereof.

We claim:

1. Temperature controller with snap-on mercury displacement relay module comprising:
  a. an electronic temperature controller including a housing, a front side, back side and surrounding sides, a circuit board positioned within said housing, a plurality of upper and lower beveled tabs extending from a rear side of said housing, a plurality of holes in a lower portion of said rear of said housing, and a plurality of spring clips positioned on said circuit board in said housing and positioned behind each of said holes; and,
  b. a relay coil assembly including a housing supporting at least one relay, a plurality of ball-stud assemblies extending out from a lower portion of said housing, an upper groove of said coil assembly housing accepting said upper tabs of said controller housing, and a mounting block for said ball-stud assembly, on said coil assembly housing frictionally engaging with said lower tab of said electronic controller.

2. Controller of claim 1 including a potentiometer on said circuit board, a configured collar, an insert, and a potentiometer knob.

3. Controller of claim 2 wherein said housing includes a hole in said front cover of said controller housing, an opposing flat member, a top slot in said hole, and an arcuate groove surrounding said hole.

4. Controller of claim 2 wherein said potentiometer knob includes a flat portion for accepting said insert.

5. Controller of claim 2 wherein said configured collar includes a tab.

* * * * *